United States Patent [19]

Schnable

[11] Patent Number: 4,732,867

[45] Date of Patent: Mar. 22, 1988

[54] METHOD OF FORMING ALIGNMENT MARKS IN SAPPHIRE

[75] Inventor: George L. Schnable, Lansdale, Pa.

[73] Assignee: General Electric Company, Schenectady, N.Y.

[21] Appl. No.: 925,983

[22] Filed: Nov. 3, 1986

[51] Int. Cl.$^4$ .................... H01L 17/00; H04L 21/265
[52] U.S. Cl. .............................. 437/22; 148/DIG. 83; 437/20; 437/24; 437/247
[58] Field of Search ..................... 437/20, 21, 247, 24, 437/37, 22; 427/38; 29/576 B

[56] References Cited

U.S. PATENT DOCUMENTS

| | | | |
|---|---|---|---|
| 3,909,307 | 8/1975 | Stein | 148/1.5 |
| 4,081,292 | 3/1978 | Aoki et al. | 148/1.5 |
| 4,348,803 | 9/1982 | Sasaki | 29/574 |
| 4,395,467 | 7/1983 | Vossen, Jr. et al. | 204/192.2 |
| 4,466,839 | 8/1984 | Dathe et al. | 148/1.5 |
| 4,509,990 | 4/1985 | Vasudev | 148/1.5 |
| 4,515,642 | 5/1985 | Ajima et al. | 148/1.5 |
| 4,522,656 | 6/1985 | Kuhnenfeld et al. | 148/1.5 |
| 4,534,804 | 8/1985 | Cade | 148/1.5 |
| 4,592,129 | 6/1986 | Legge | 29/572 |
| 4,634,473 | 1/1987 | Swartz et al. | 148/1.5 |

OTHER PUBLICATIONS

Reedy et al., Jour. Crystal Growth, 58 (1982), 53.
"Special Purpose Materials," U.S. Department of Energy Annual Progress Report DOE/ER-0048/1, Apr. 1980, pp. 19–26.
D. Lynn et al., "Thermionic Integrated Circuits: Electronics for Hostile Environments," *IEEE Transactions on Nuclear Science,* vol. NS-32, No. 6, Dec. 1985, pp. 3996–4000.
Y. Yamamoto et al., "Influence of Implantation Induced Damage in Sapphire upon Improvement of Crystalline Quality of Silicon on Sapphire," *Applied Physics Letter,* vol. 47, No. 12, Dec. 15, 1985, pp. 1315–1317.
Japanese Journal of Applied Physics, vol. 24, No. 8, pp. 1115 and 1116.
Japanese Journal of Applied Physics, vol. 24, No. 11, pp. L880–L882.
Gems Made by Man, by Nassau, Chilton Book Co., 1980, pp. 74 and 75.
H. Naramoto et al., "Ion Implantation and Thermal Annealing of $\alpha$-Al$_2$O$_3$ Single Crystals," *Journal of Applied Physics,* vol. 54, No. 2, Feb. 1983, pp. 683–698.

*Primary Examiner*—Upendra Roy
*Attorney, Agent, or Firm*—Henry I. Steckler; Allen L. Limberg

[57] ABSTRACT

Indicia are formed in a sapphire substrate by ion implantation with a sufficient amount of silicon ions to establish a contrast with the remainder of the substrate. The implant is annealed at 1050° to 1200° C. under an oxygen or inert atmosphere. The implants are stable to repeated heatings to elevated temperature. The implants are further beneficial in that they do not introduce a source of contamination into the substrate.

7 Claims, No Drawings

METHOD OF FORMING ALIGNMENT MARKS IN SAPPHIRE

This invention was made with Government support under Contract No. DASG60-85-C-0117 awarded by the Department of the Army. The Government has certain rights in this invention.

This invention pertains to an improved method of providing alignment marks in sapphire by ion implantation.

BACKGROUND OF THE INVENTION the use of sapphire substrates in the production of semiconductor devices, such as silicon-on-sapphire (SOS) devices, has increased significantly in recent years. The term sapphire indicates alpha aluminum oxide ($Al_2O_3$). It is necessary in the production of such devices that the sapphire substrates be marked with identification and alignment marks. The latter are particularly important for the aligning of patterned resist layers for processes such as localized oxygen implants and the like. It will be appreciated that, as the dimensions of the pattern to be formed in or on the sapphire substrate shrink, the necessity for accurate alignment of photomasks and the like becomes more acute.

One method of marking sapphire substrates which has been utilized is the engraving of a mark into the substrate with, e.g. a diamond tool. Although effective, engraving of sapphire substrates produces a stress which can cause cracking of the substrate as a result of the heating and cooling that are necessary to form a device thereon. Sapphire substrates are subject to cracking even when heating and cooling cycles are carefully controlled.

More recently, sapphire substrates have been marked with indicia, such as identification marks, by selective doping with an impurity which develops a color. Sasaki, U.S. Pat. No. 4,348,803, issued Sept. 14, 1982, discloses producing color indicia in a sapphire substrate by doping with chromium or titanium.

Saito et al. in two articles in the Japanese Journal of Applied Physics: Vol. 24, No. 8, pp. 1115 and 1116; and No. 11, pp. L880–L882, disclose coloration of quartz and sapphire, respectively, by metal ion implantation. While these processes are efficacious in that they color the substrate, they suffer from two principal disadvantages. First, as described in the articles, the color implants have a marked tendency to fade by varying degrees depending on the temperatures to which the substrates must be subjected. Second, the disclosed processes implant metals such as niobium, iron, copper, cobalt, titanium and chromium into the substrate. Such metals are a source of contamination which, potentially, could have an adverse effect on devices incorporating the substrate.

In accordance with this invention, a method has been found to provide indicia on a sapphire substrate which suffers from neither of the above disadvantages to a marked degree.

SUMMARY OF THE INVENTION

Indicia, e.g. alignment marks, are formed in a sapphire substrate by ion implantation thereof with a dosage of silicon ions sufficient to contrast the implanted area from the remainder of the substrate.

DETAILED DESCRIPTION OF THE INVENTION

In accordance with this invention, sapphire substrates are marked with appropriate alignment indicia by ion implantation with silicon ions. The ion implantation of silicon gives sapphire a brownish-yellow color. This is due to the absorption of light of shorter wavelengths and an interference color caused by the reflection of light from the upper silicon-aluminum oxide interface.

Regardless of the exact mechanism responsible for the color formation, the color indicia produced by the subject process are advantageous in that they do not substantially fade after repeated exposures to high temperatures, i.e. in excess of 1000° C. Further, indicia produced in a sapphire substrate by the subject method is unaffected by immersion in a nitric acid/hydrofluoric acid solution. This indicates that the silicon implant is protected by an overlying layer of $Al_2O_3$.

Implanting of indicia marks into sapphire in accordance with this invention is carried out on conventional apparatus, preferably a high-current ion implant machine. Although a relatively light implant dosage of $2 \times 10^{15}$ ions/cm$^2$ will produce indicia discernible after annealing, it is preferred that the implant dosage of silicon ions be at least about $1 \times 10^{16}$ ions/cm$^2$ and preferably from about $1 \times 10^{17}$ to $2 \times 10^{17}$ ions/cm$^2$. There is typically produced a readily visible brownish-yellow indicia in the sapphire substrate.

The indicia implant is annealed at a temperature between about 1050° and 1200° C., preferably at about 1100° C. It is preferred that a heat means be utilized which heats the whole wafer, i.e. a tube furnace as opposed to a heating means such as a laser which heats only the surface. It is preferred to heat the whole substrate because less stress is created than when only the surface is heated. Annealing is suitably carried out in oxygen or an inert ambient such as argon.

Annealing the indicia formed in accordance with this invention will cause a reduction in intensity. Even conventional annealing in a furnace, e.g. at 1100° C., in oxygen for 30 minutes, does not reduce the intensity of the indicia to the point where their usefulness would be impaired. The indicia may undergo some additional reduction in intensity during subsequent processing of the sapphire substrate, but not to a degree which would be considered detrimental. As most processing operations are carried out at comparatively low temperatures, the effect thereof is considered negligible.

The method of forming alignment marks or other indicia in a sapphire substrate in accordance with this invention is advantageous in it does not introduce a contaminant material into the sapphire substrate which might interfere with the functioning of a device fabricated thereon.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

A circular sapphire substrate 100 mm in diameter, 1102 orientation, was placed into a Varian Model 160-10 high-current ion implant machine. Predetermined portions of the substrate surface were ion implanted with $1 \times 10^{17}$ ions per square centimeter of silicon ions ($^{28}$Si$^{30}$) at 160 KeV utilizing a conformal ion implantation mask. The implanted regions had a brownish-yellow color and were clearly visible. The substrates were placed into a conventional furnace and annealed for 30 minutes at 1100° under an oxygen atmosphere. Although somewhat diminished in intensity, the implanted areas were still clearly visible.

The substrate was placed into a high-intensity, visible light annealer, Varian-Extrion RTP-800 and heated to 1350° for 20 seconds in dry nitrogen. The substrate was allowed to return to ambient. All indicia were still clearly visible.

What is claimed is:

1. A process for producing indicia in a sapphire substrate comprising ion implanting a portion of the substrate with a dosage of silicon ions sufficient to contrast the implanted portion from the remainder of the substrate.

2. A process in accordance with claim 1, wherein the dosage of silicon ions is at least about $1 \times 10^{16}$ ions/cm$^2$.

3. A process in accordance with claim 1, wherein the implant is annealed at a temperature between about 1050° and 1200° C.

4. A process in accordance with claim 2, wherein the dosage of silicon ions is from about $1 \times 10^{17}$ to $2 \times 10^{17}$ ions per cm$^2$.

5. A process in accordance with claim 3, wherein the implant is annealed at 1100° C.

6. A process in accordance with claim 3, wherein the implant is annealed in an oxygen atmosphere.

7. A process in accordance with claim 3, wherein the implant is annealed in an argon atmosphere.

* * * * *